(12) United States Patent
Basson et al.

(10) Patent No.: US 11,276,545 B1
(45) Date of Patent: Mar. 15, 2022

(54) COMPENSATING FOR AN ELECTROMAGNETIC INTERFERENCE INDUCED DEVIATION OF AN ELECTRON BEAM

(71) Applicant: APPLIED MATERIALS ISRAEL LTD., Rehovot (IL)

(72) Inventors: Yosef Basson, Mazkeret-Batya (IL); Yuri Belenky, Be'er-Ya'akov (IL); Mordechai Rozen, Rishon-LeZion (IL); Lior Klein, Ramat-Gan (IL); Asaf Grosz, Ramat-Gan (IL)

(73) Assignees: APPLIED MATERIALS ISRAEL LTD., Rehovot (IL); BAR ILAN UNIVERSITY, Ramat Gan (IL); B.G. NeaevTechnoloaies and Apolications Ltd., Beer-Sheva (IL)

( * ) Notice: Subject to any disclaimer, the term of this patent is extended or adjusted under 35 U.S.C. 154(b) by 0 days.

(21) Appl. No.: 17/131,666

(22) Filed: Dec. 22, 2020

(51) Int. Cl.
 *H01J 37/09* (2006.01)
 *H01J 37/244* (2006.01)
 *H01J 37/28* (2006.01)

(52) U.S. Cl.
 CPC ............ *H01J 37/09* (2013.01); *H01J 37/244* (2013.01); *H01J 37/28* (2013.01); *H01J 2237/153* (2013.01); *H01J 2237/24564* (2013.01)

(58) Field of Classification Search
 CPC .......... H01J 37/09; H01J 37/244; H01J 37/28; H01J 2237/153; H01J 2237/24564
 See application file for complete search history.

(56) References Cited

U.S. PATENT DOCUMENTS

| | | | |
|---|---|---|---|
| 7,440,227 B2* | 10/2008 | Chattopadhyay | G11B 5/376 360/112 |
| 2004/0066674 A1* | 4/2004 | Tang | G01L 9/16 365/200 |
| 2004/0070038 A1* | 4/2004 | Tang | H01L 43/065 257/421 |
| 2007/0096228 A1* | 5/2007 | Ahn | G11C 11/18 257/421 |
| 2014/0247043 A1* | 9/2014 | Klein | G01R 33/07 324/251 |
| 2015/0241525 A1* | 8/2015 | Yang | G03F 7/70775 318/135 |
| 2020/0003850 A1* | 1/2020 | Klein | H01L 43/06 |

* cited by examiner

*Primary Examiner* — David A Vanore
(74) *Attorney, Agent, or Firm* — Kilpatrick Townsend & Stockton LLP

(57) ABSTRACT

A method, a non-transitory computer readable medium and a system for compensating for an electromagnetic interference induced deviation of an electron beam. The method may include obtaining measurement information about a magnetic field within an electron beam tool, the measurement information is generated by at least one planar Hall Effect magnetic sensor that is located within the electron beam tool; wherein the at least one planar Hall Effect magnetic sensor comprises at least one magnetometer integrated with at least one magnetic flux concentrator; estimating the electromagnetic interference induced deviation of the electron beam, the estimating is based on the magnetic field; and setting a trajectory of the electron beam to compensate for the electromagnetic interference induced deviation of the electron beam.

15 Claims, 11 Drawing Sheets

COMPENSATING FOR AN ELECTROMAGNETIC INTERFERENCE INDUCED DEVIATION OF AN ELECTRON BEAM

BACKGROUND OF THE INVENTION

A scanning electron microscope is a high resolution tool for evaluating a sample such as a semiconductor wafer.

There are different types of scanning electron microscopes including a review scanning electron microscope that is used to review suspected defects, and a critical dimension scanning electron microscope that is used to measure critical dimensions of microscopic structures of the sample.

A scanning electron microscope acquires frames of an area of the sample by (a) scanning the sample with a narrow electron beam of nanometric range cross section, (b) detecting, by one or more sensor of the scanning electron microscope, particles emitted from the sample as a result of the scanning, (c) generating detection signals that represent the detected particles, and (d) generating a frame based on the expected location of the electron beam with detection signals acquired due to the illumination of the expected location.

A scanning electron microscope includes a vacuum chamber that maintains the sample within a vacuumed environment, during at least a part of the evaluation process. The scanning electron microscope also includes a scanning electron microscope column that maintains a vacuumed environment and emits the electron beam towards the sample, within the electron beam tool.

A scanning electron microscope is subjected to electromagnetic interference from one or more electromagnetic interference sources. For example, a scanning electron microscope that is located in a semiconductor fabrication plant (FAB) may be subjected to electromagnetic interference emitted from at least one out of (a) alternating current (AC) power supply (typical electromagnetic interference frequency of 50 Hertz or 60 Hertz), (b) slow varying direct current (DC) interference from moving ferromagnetic items (for example elevators), and (c) overhead transport mechanism (typical electromagnetic interference frequency of about 50 KiloHertz).

The vacuum chamber may only mask a part of the electromagnetic interference from entering the vacuum chamber. The electron beam that propagates within the vacuumed environment is still subjected to electromagnetic interference.

There is a growing need to accurately evaluate the electromagnetic interference that is maintained in the vacuum chamber.

BRIEF SUMMARY OF THE INVENTION

There may be provided a method, a non-transitory computer readable medium and a detection system for accurately evaluating electromagnetic interference within a vacuum chamber and for compensating for a distortion caused by the electromagnetic interference.

According to some embodiments, a method for compensating for an electromagnetic interference induced deviation of an electron beam is provided where the method includes: obtaining measurement information about a magnetic field within an electron beam tool, the measurement information is generated by at least one planar Hall Effect magnetic sensor that is located within the electron beam tool, wherein the at least one planar Hall Effect magnetic sensor comprises at least one magnetometer integrated with at least one magnetic flux concentrator; estimating, based on the magnetic field, the electromagnetic interference induced deviation of the electron beam; and setting a trajectory of the electron beam to compensate for the electromagnetic interference induced deviation of the electron beam.

In various implementations, the method can further include on or more of the following features. The setting of the trajectory of the electron beam can include causing the electron beam to follow an expected scan pattern despite a presence of the electromagnetic interference. The obtaining, estimating, and the setting can be repeated during an acquisition of a frame. The method can further include setting the trajectory of the electron beam during an acquisition of a current frame, wherein the setting of the trajectory is based on the estimating of the electromagnetic interference induced deviation of the electron beam during an acquisition of a previous frame. The magnetic field can include multiple magnetic field components, wherein the at least one planar Hall Effect magnetic sensor comprises multiple planar Hall Effect magnetic sensors and, in some embodiments, the multiple magnetic field components differ from each other by direction. The multiple planar Hall Effect magnetic sensors can be positioned to measure magnetic fields at different locations along a path that is proximate to a path of the electron beam. The electron beam can propagate along a path that starts at an end of a an electron beam column and ends at a sample, wherein the at least one planar Hall Effect magnetic sensor is positioned to sense the magnetic field at a start of the path or an end of the path. The at least one planar Hall Effect magnetic sensor can have an equivalent magnetic noise that does not exceed 5 pT/√Hertz at 10 Hertz. Setting a trajectory of the electron beam can include feeding compensating control signals to one or more electron beam deflectors.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE INVENTION

Figure 1:
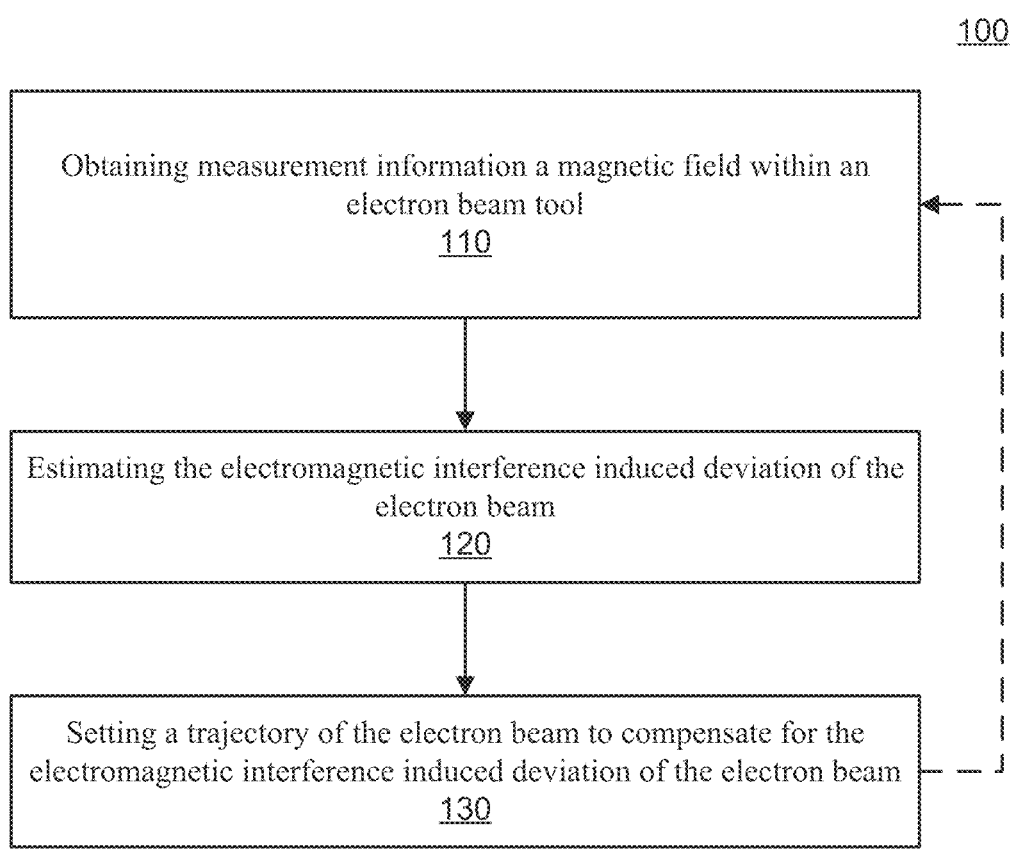
FIG. 1 illustrates an example of a method according to some embodiments.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

The term "and/or" means additionally or alternatively.

The term "electron beam tool" refers to a tool that may generate one or more electron beams and scan a sample (or an area of the sample) with the one or more electron beams. A scanning electron microscope is a non-limiting example of an electron beam tool.

The term "an electromagnetic interference induced deviation of an electron beam" means a deviation of the electron beam from a desired path due to electromagnetic interference. The electromagnetic interference induced deviation of the electron beam causes the electron beam to deviate from an expected scan pattern that the electron beam should follow.

The electromagnetic interference outside the electron beam tool is stronger than the electromagnetic interference within the electron beam tool. Various prior art solutions for monitoring electromagnetic interference used an electromagnetic interference sensor (such as a Spicer SC24) located outside the electron beam tool because the electromagnetic interference sensor was not sensitive enough to sense the weaker electromagnetic interference within the electron beam tool or it was too large and positioning such electromagnetic interference sensors within the electron beam tool was not feasible.

Sensing the electromagnetic interference outside the electron beam tool is less accurate, especially when the magnetic field near the electron beam may be substantially different than the electromagnetic interference outside the electron beam tool.

An estimation of the magnetic field within the electron beam tool based on the electromagnetic interference outside the vacuum chamber is inaccurate. The vacuum chamber, elements within the vacuum chamber and/or outside the vacuum chamber, particularly magnetic shielding elements, may introduce unpredictable changes to the magnetic fields. For example, the masking of the electromagnetic interference by the magnetic shielding elements is not homogenous, and electromagnetic interference sources from various directions introduce different electromagnetic interference within the electron beam tool.

There is provided a solution that uses a magnetic sensor that is highly-sensitive and compact.

The magnetic sensor that is used to sense the magnetic field within the electron beam tool is a planar Hall Effect magnetic sensor integrated (or not integrated) with at least one magnetic flux concentrator. The magnetometer may have an elliptical shape. The dimensions of the magnetometer determine the response to the magnetic field. The magnetic field measurement is based on the planar Hall effect which is measured by driving a current through one axis of the elliptic magnetometer and measuring the transverse voltage along another axis.

The magnetic flux concentrators concentrate the magnetic flux of a large volume within a smaller volume near the magnetometer. The concentration of the magnetic flux increases the sensitivity of the magnetic sensor. The magnetic sensor also has a very low equivalent magnetic noise, for example, an equivalent magnetic noise of 5 pT/(Hertz)$^{1/2}$ at a frequency of 10 Hertz, which contributed to the sensitivity of the magnetic sensor.

The magnetic sensor is at least ten times more sensitive to electromagnetic interference in relation to other magnetoresistive sensors and is more than an order of magnitude smaller in all three dimensions compared to Spicer SC24.

The magnetic sensor may be positioned within a sensing unit that has a length, a width and a height may at an order of one to few centimeters each.

FIG. 1 illustrates an example of a method 100.

Method 100 is for compensating for an electromagnetic interference induced deviation of an electron beam.

Method 100 may start by step 110 of obtaining measurement information a magnetic field within the electron beam tool. The measurement information may be related to at least one component of the magnetic field.

The measurement information is generated by at least one planar Hall Effect magnetic sensor that is located within the electron beam tool. The at least one planar Hall Effect magnetic sensor may include at least one magnetometer integrated with at least one magnetic flux concentrator. The at least one planar Hall Effect magnetic sensor is compact and highly sensitive.

Step 110 may include measuring the at least one magnetic field component within the electron beam tool to provide the measurement information.

Alternatively, step 110 may include receiving the measurement information by a computerized unit. The computerized unit may be located outside the electron beam tool.

The measurement information may include detection signals from the at least one planar Hall Effect magnetic sensor that is located within the electron beam tool.

The measurement information may include an outcome of a processing of the detection signals. The processing may include any processing step, such as but not limited to filtering, smoothing, noise reduction, and the like.

The at least one magnetic field component may be up to three magnetic field components of magnetic fields measured at different locations within the electron beam tool, and the at least one magnetic sensor may be multiple magnetic sensors (at least one magnetic sensor per one field component at any location within the electron beam tool).

At least two magnetic field components may differ from each other by direction.

The multiple magnetic sensors may be positioned to measure magnetic fields at different locations along a path that may be proximate to a path of the electron beam. Proximate may be within a distance of less than 10, 20, 30, 40 centimeters and the like.

The electron beam may propagate along a path that starts at an end of an electron beam column and ends at the sample.

At the start of the path, the electrons of the electron beam are accelerated. At the end of the path, the electrons of the electron beam are decelerated. The electrons of the electron beam are more susceptible to the electromagnetic interference at the start of the path and at the end of the path.

At least one sensing unit may be positioned to sense the at least one magnetic field component at a start of the path and/or at end of the path.

Step 110 may be followed by step 120 of estimating the electromagnetic interference induced deviation of the electron beam. The estimating may be based on the at least one magnetic field component. Additionally or alternatively, the estimation may be based on a deviation of a frame (or an anchor within the frame) from an expected frame (or an expected anchor within the frame). An anchor may be a structure of known shape and size. The structure may be an edge, a recess, a line, and the like.

The relationship between the at least one magnetic field component and the deviation may be measured during a test period, may be simulated, may be calculated, or may be learnt in any manner.

Step 120 may be followed by step 130 of setting a trajectory of the electron beam to compensate for the electromagnetic interference induced deviation of the electron beam.

The trajectory may be set such as to cancel the electromagnetic interference induced deviation. The trajectory may be set to substantially reduce the electromagnetic interference induced deviation. The trajectory should be changed so that the electron beam will follow the expected scan pattern despite the presence of the electromagnetic interference.

The reduction of the deviation may position the electron beam within a tolerable difference of its expected trajectory. A tolerable difference may be determined or defined in various manners—for example based on the size of the spot formed by the electron beam on the sample, based on a predefined accuracy of the deflection of the electron beam, based on a tolerance associated with the expected scan pattern, based on overlap between beams of different lines of a scan pattern and the like. For example—a deviation of less than 1, 2, 3, 4, 5, 6 percent of a diameter of the spot may be tolerable.

Step 130 may include determine how to change at least one parameter of the optics of the electron beam tool to compensate for the electromagnetic interference induced deviation of the electron beam.

The at least one parameter may be a deflection introduced by one or more deflecting elements (for example an electron beam deflector such as a deflection coil) that scan the beam. One or more other measures may be applied.

Step 130 may include sending commands and/or requests such as compensating control signals to optics of the electron beam tool, but may also include implementing the commands and/or requests. For example, step 130 may include sending deflection commands to one or more deflection elements but may also include implementing the deflection commands by the one or more deflection elements.

An electron beam tool may generate an image of an area by acquiring multiple frames of an area and then processing the multiple frames. The processing may include, for example, averaging the frames, or by applying other noise reduction processes.

The area may be of any shape and size.

Usually, the area is smaller than the field of view of the electron beam tool—and the scanning of the area does not require to introduce a mechanical movement of the sample and/or the an electron beam column.

Step 110, step 120 and step 130 may be executed while acquiring a part of a frame of an area of the sample, while acquiring a single frame of the area, while acquiring multiple frames of the area, while acquiring a part of a frame of each area of multiple areas of the sample, while acquiring a single frame of each area of multiple areas of the sample, while acquiring multiple frames of each area of multiple areas of the sample, and the like.

It should be noted that method 100 may be executed in order to predict future deviations of the electron beam. For example, the method may include learning the change of electromagnetic interference over time, predicting future changes of the electromagnetic interference based on the outcome of the learning, estimating the future electromagnetic interference induced deviation of the electron beam, and setting a future trajectory of the electron beam to compensate for the future electromagnetic interference induced deviation of the electron beam.

For example, assuming that multiple frames of an area should be acquired, then step 120 and step 130 may be applied during the acquisition of a certain frame, whereas step 120 and step 130 may be based, at least in part, on measurement information acquired during the acquisition of a previous frame.

Such prediction may be provided as a backup in case that a temporary error occurs in the obtaining of the current measurement information.

Figure 2:
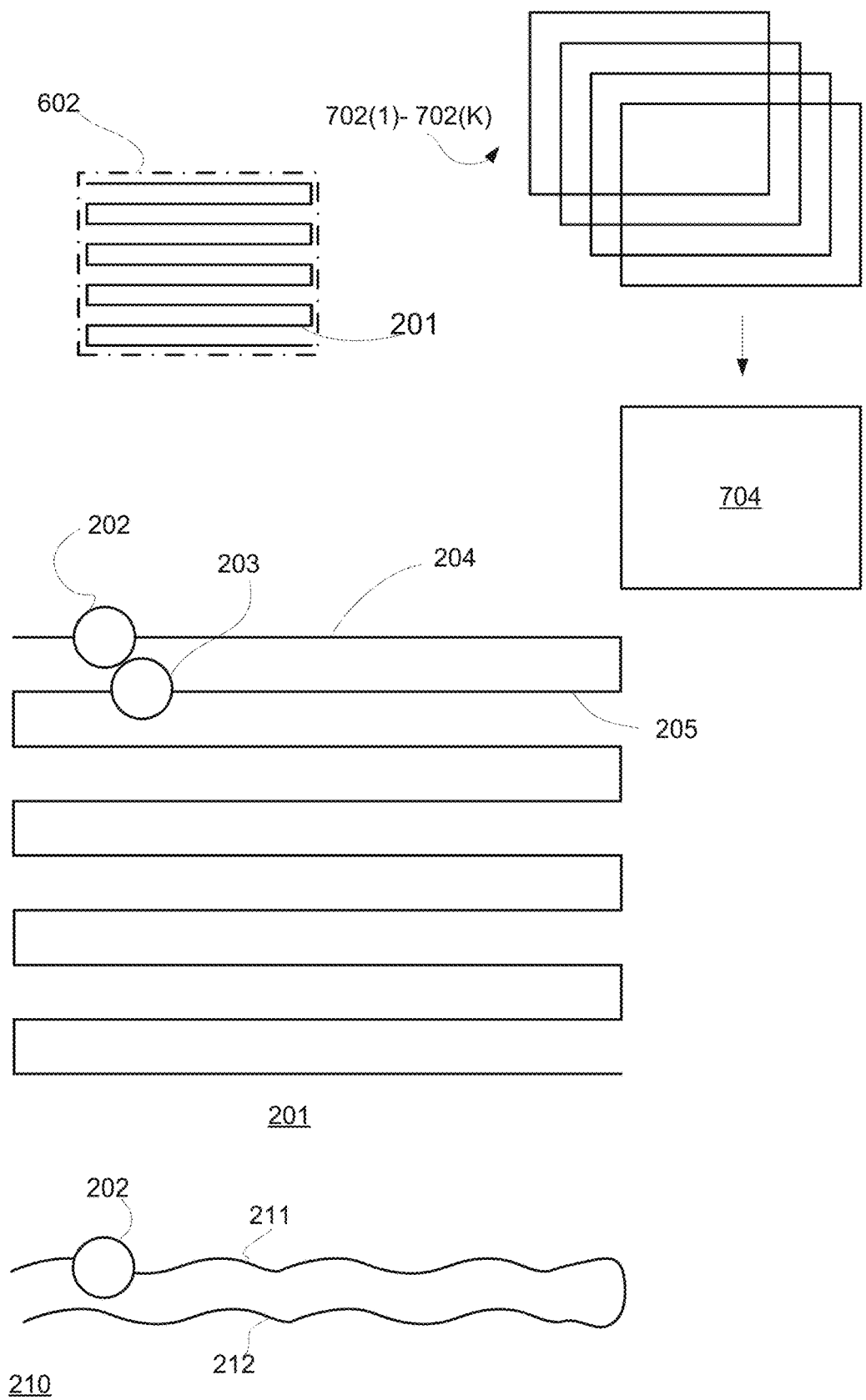
FIG. 2 illustrates examples of a scan pattern, frames and an image according to some embodiments.

FIG. 2 illustrates examples of a scan pattern, frames and an image.

The electron beam tool may acquire multiple frames 702(1)-702(K) of an area 602 of a sample and then process the multiple frames to provide an image 704 of the area. K is an integer that exceeds one. During an acquisition of each frame the electron beam should follow an expected scan pattern such as raster scan pattern.

FIG. 2 illustrates an expected scan pattern 201 that is a raster scan pattern. Spot 202 and spot 203 illustrate that there is a slight overlap between the areas covered when following line 204 and line 205 of the raster scan pattern.

FIG. 2 also illustrates a part 210 of a distorted scan pattern, the electron beam follows two noisy curves 211 and 212 instead the line 204 and line 205.

FIGS. 3-8 illustrate examples of an electron beam tool and one or more locations of one or more sensing units. Each sensing unit may include one or more the magnetic sensor.

One or more sensing units may be located anywhere within the electron beam tool. For example, within a vacuum chamber of the electron beam tool, outside the vacuum chamber of the electron beam tool, within an electron beam column of the electron beam tool, outside the electron beam column of the electron beam tool.

FIGS. 3-8 merely provide some example of the locations of the sensing unit. In some figures various reference numbers and/or boxes were omitted for simplicity of explanations.

Figure 3:
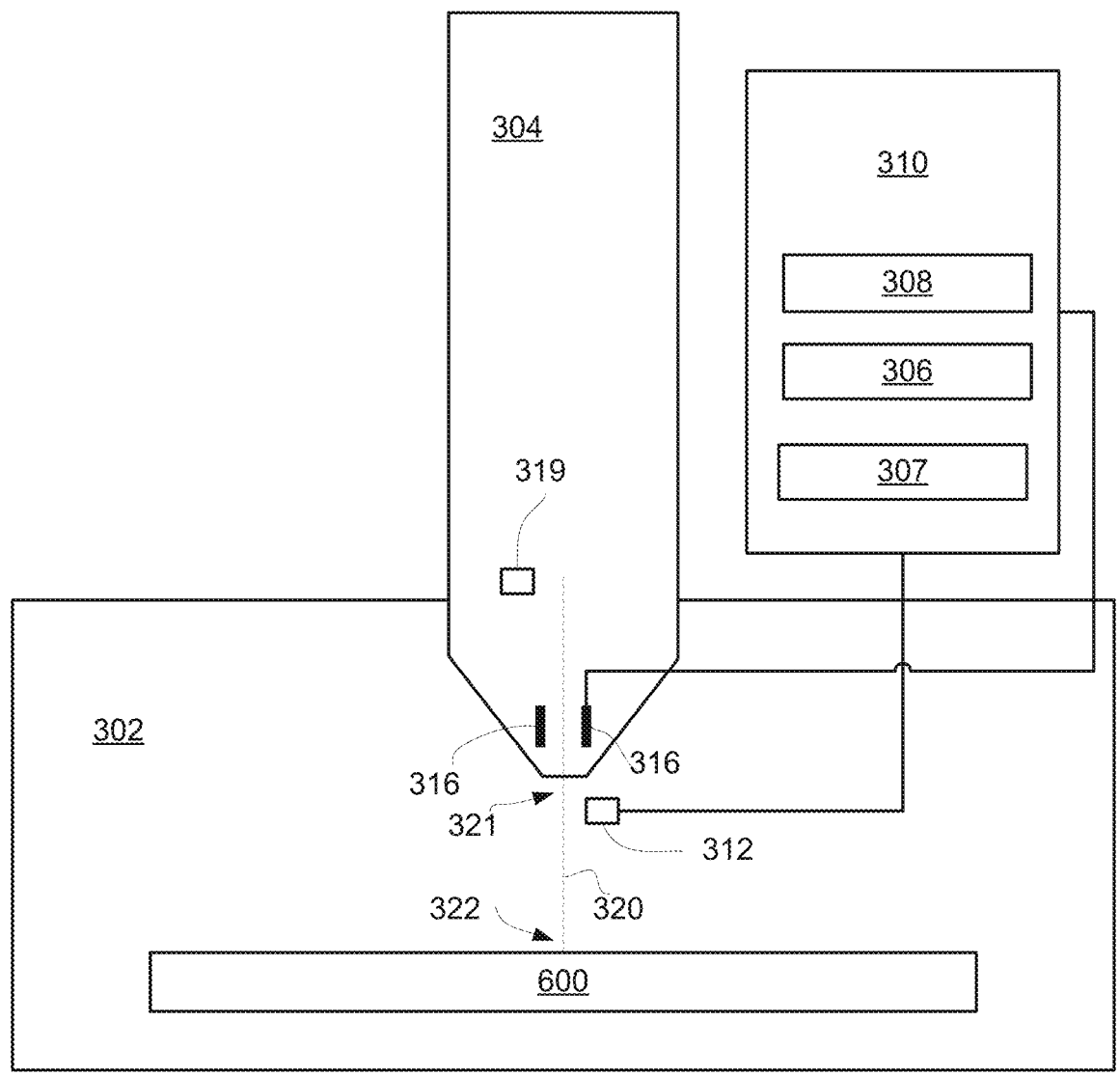
FIGS. 3-8 illustrate examples of an electron beam tool and one or more locations of a sensing unit according to some embodiments.

FIG. 3 illustrates an electron beam tool 300 and a sample 600.

The electron beam tool may include a vacuum chamber 302, an electron beam column 304, deflection coils 316, and a computerized unit 310 that may include a controller 306, a memory unit 307, and a processor 308.

It should be noted that the computerized unit 310 may belong to the electron beam tool but this is not necessarily so.

The processor 308 and/or the controller 306 may be configured to act as a deviation estimator. The processor and/or a computer may perform image processing that may include generating frames and/or generating images from detection signals of one or more sensors (for example secondary sensor 319) of the electron beam tool.

It should be noted that at least one function of the computerized unit 310 (for example, image processing, estimation of the electromagnetic interference induced deviation of the electron beam, and/or determining how to compensate for the deviation) may be executed by another computerized unit that does not belong to the electron beam tool.

The other computerized unit may be located at the vicinity of the electron beam tool (for example located at the same room or space as the electron beam tool, located at the same FAB as the electron beam tool), or may even be a remote computerized system located far away from the electron beam tool (for example located outside the FAB, located in a cloud computing environment, and the like).

The controller 306 may control the operation of the electron beam tool.

The electron beam tool may have any kind of sensors, including but not limited to one or more secondary electron sensors, one or more backscattered electron sensors, one or more photon sensor, one or more x-ray sensors, and like. The one or more sensors of the electron beam tool may be located within the electron beam column, outside the electron beam column and within the vacuum chamber.

FIG. 3 illustrates a path 320 of the electron beam from the electron beam column to the sample. The path has a start 321 and an end 322.

FIG. 3 illustrates the sensing unit 312 as positioned near the start 321 of the path.

Figure 4:
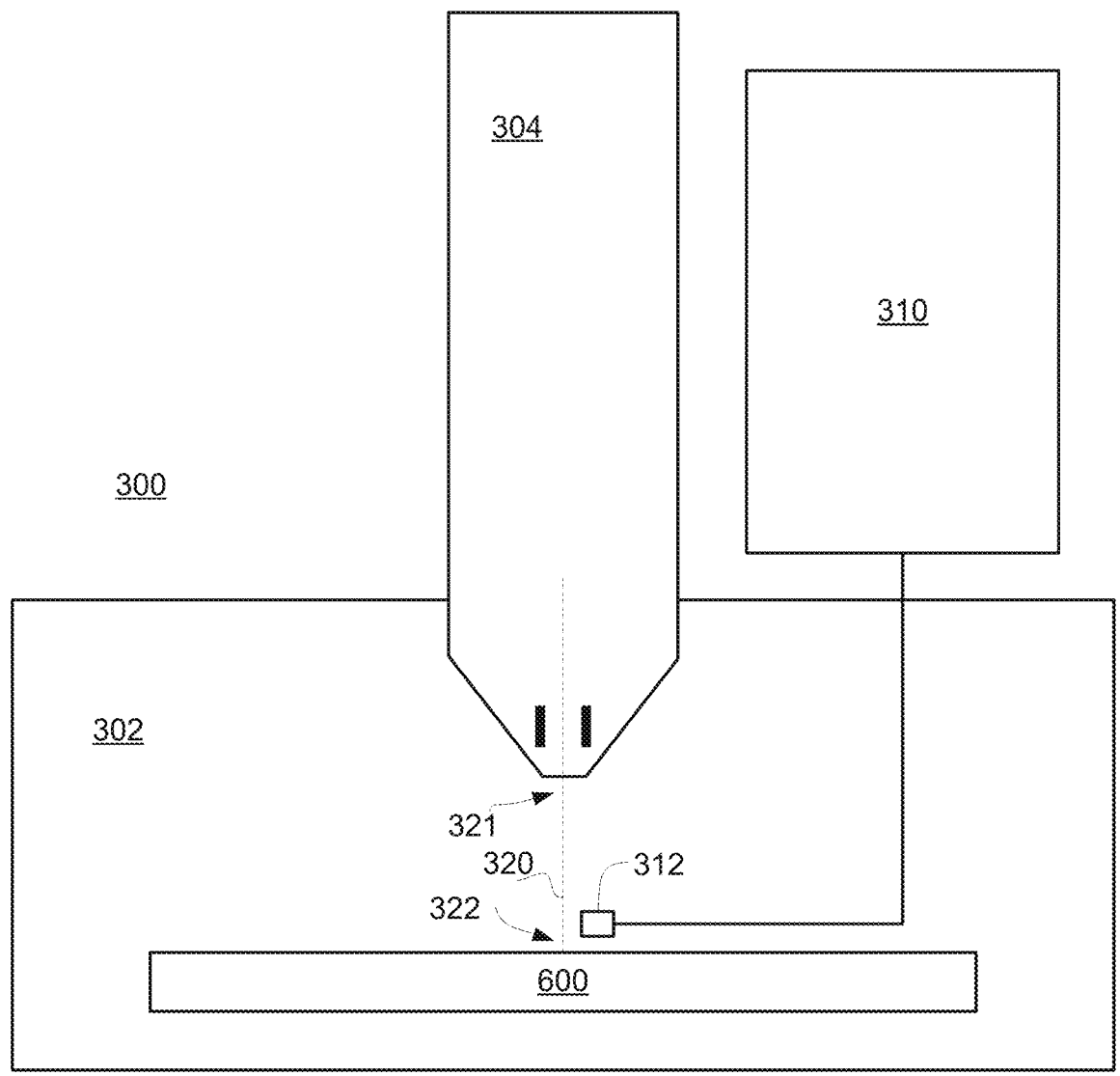

FIG. 4 illustrates the sensing unit 312 as positioned near the end 322 of the path.

Figure 5:
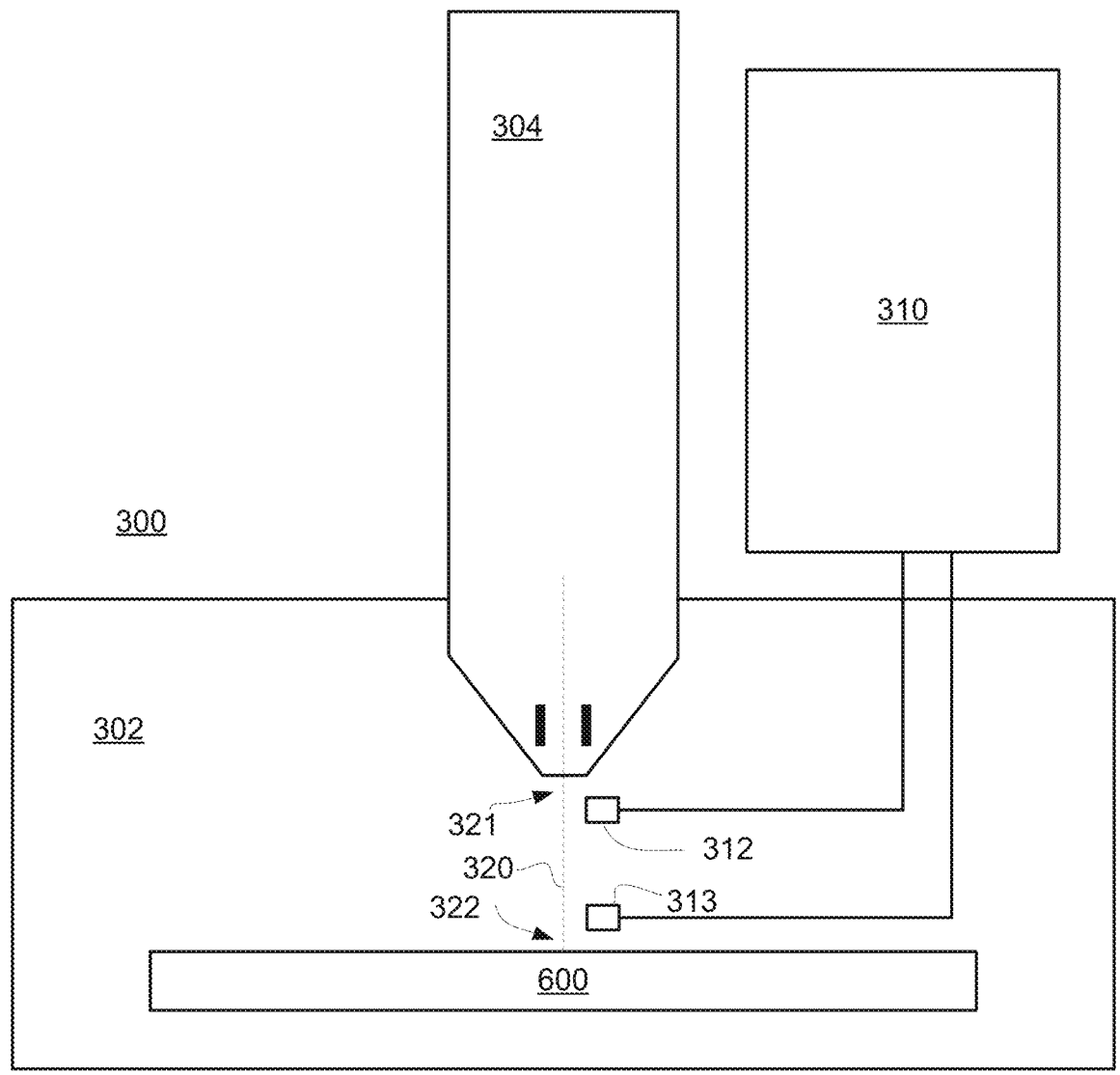

FIG. 5 illustrates the sensing unit 312 as positioned near the start 321 of the path, and another sensing unit 313 as positioned near the end 322 of the path.

The sample 600 is supported by a mechanical unit 350 that may include a chuck and/or a mechanical stage.

Figure 6:
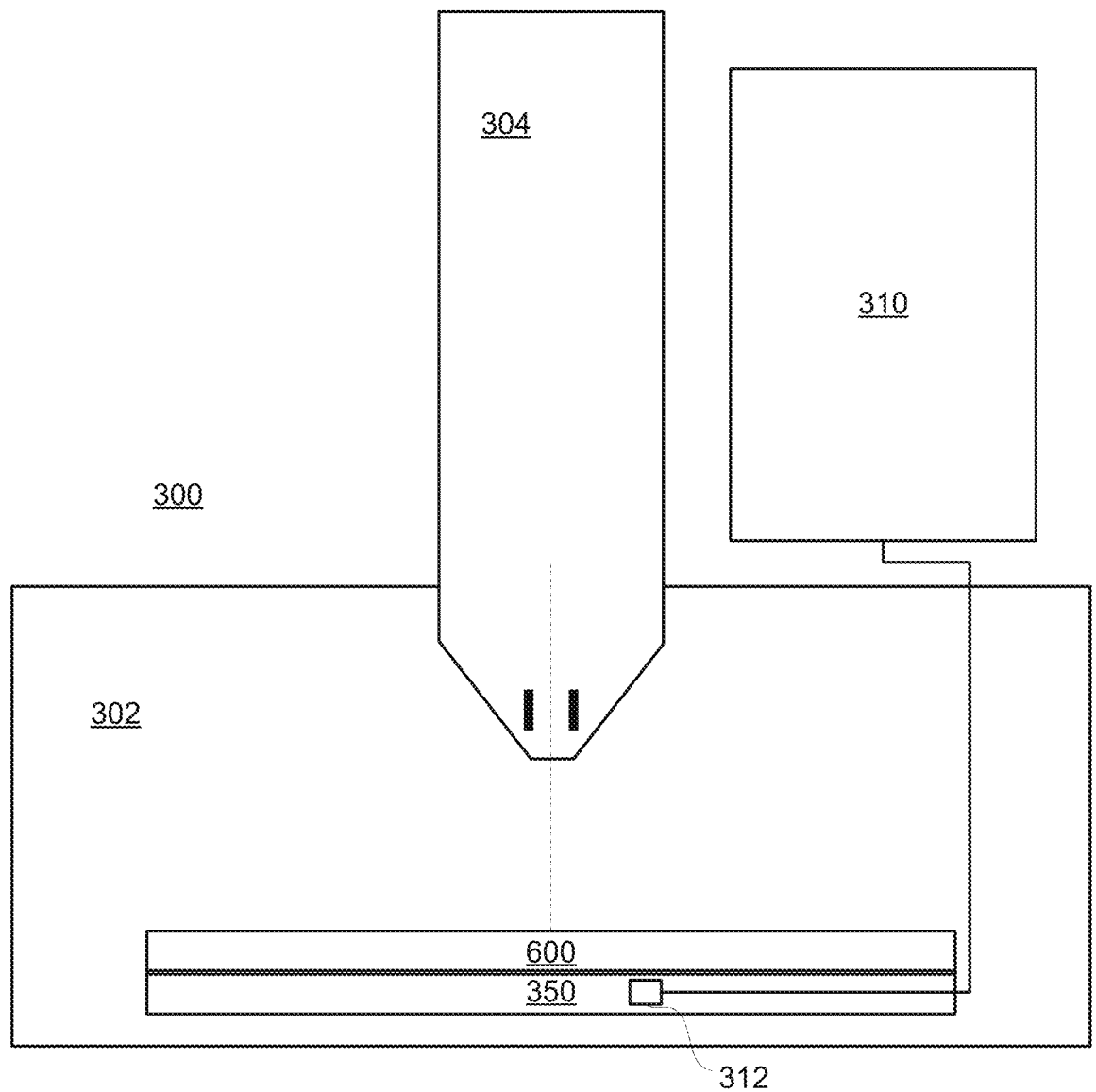

FIG. 6 illustrates the sensing unit 312 as positioned in the mechanical unit 350. It should be noted that the sensing unit 312 may be connected to the mechanical unit 350 without being included in the mechanical unit 350.

Figure 7:
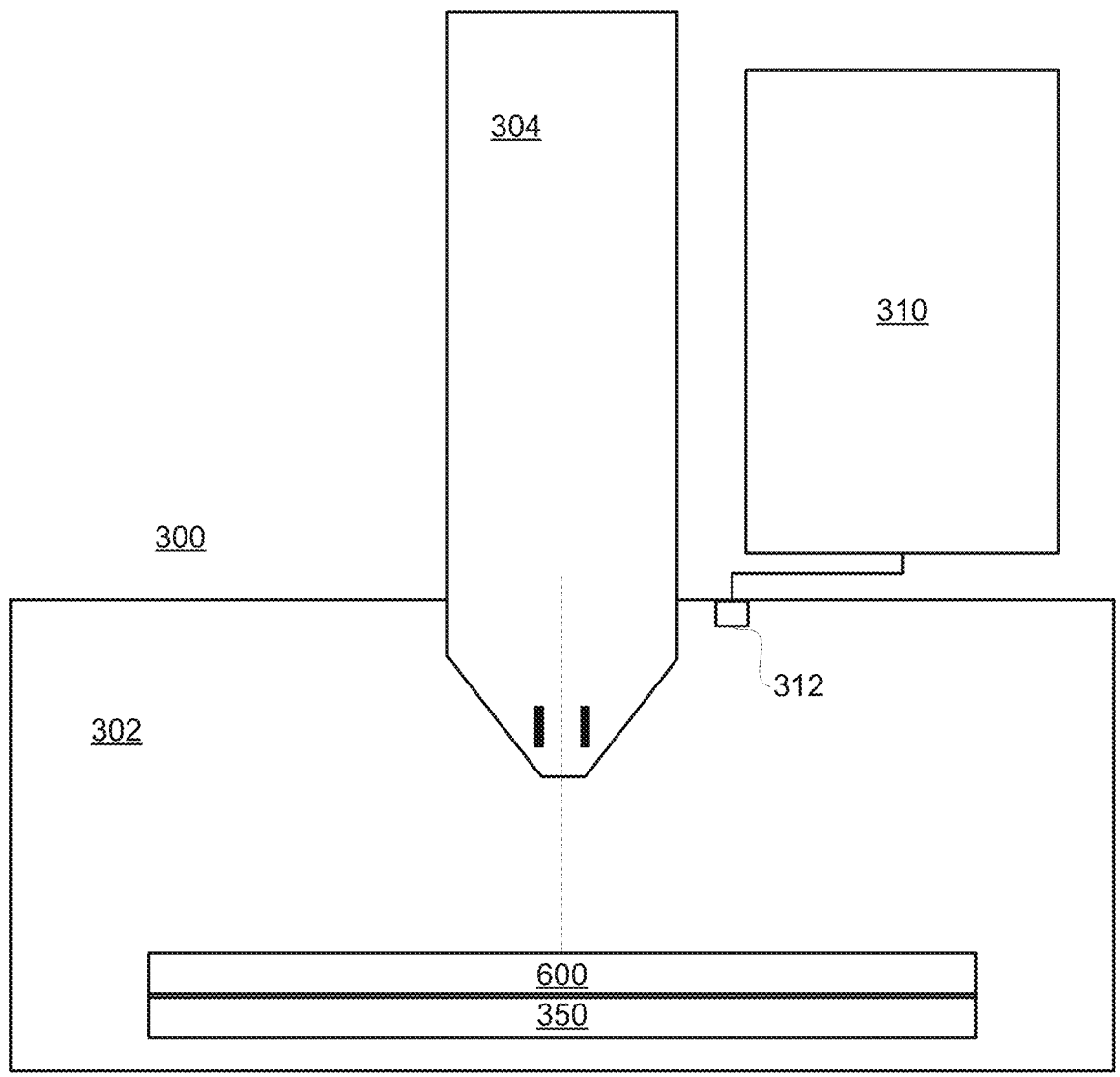

FIG. 7 illustrates the sensing unit 312 as positioned near an upper wall of the vacuum chamber 302.

Figure 8:
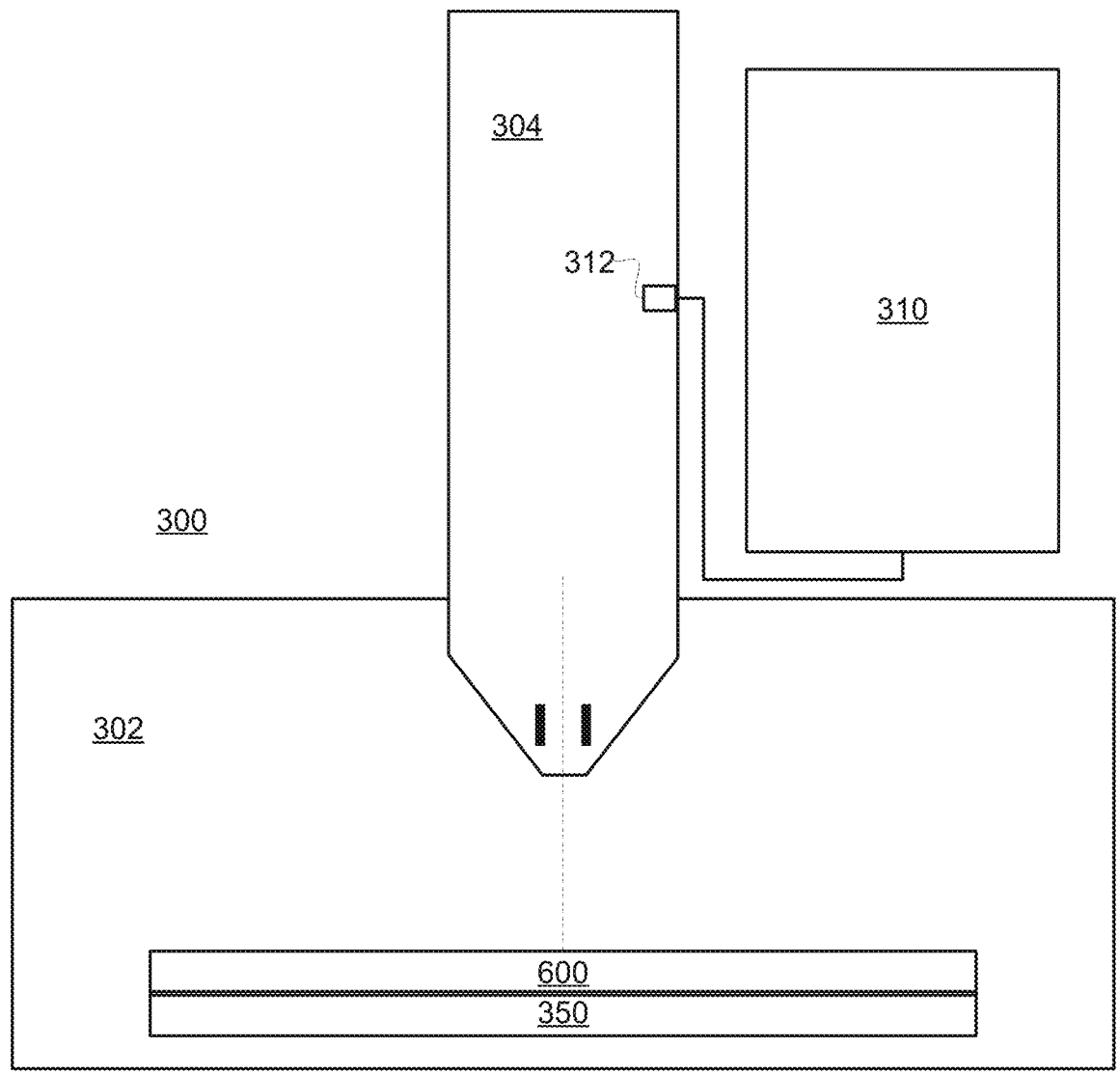

FIG. 8 illustrates the sensing unit 312 as positioned within the electron beam column 304.

Figure 9:
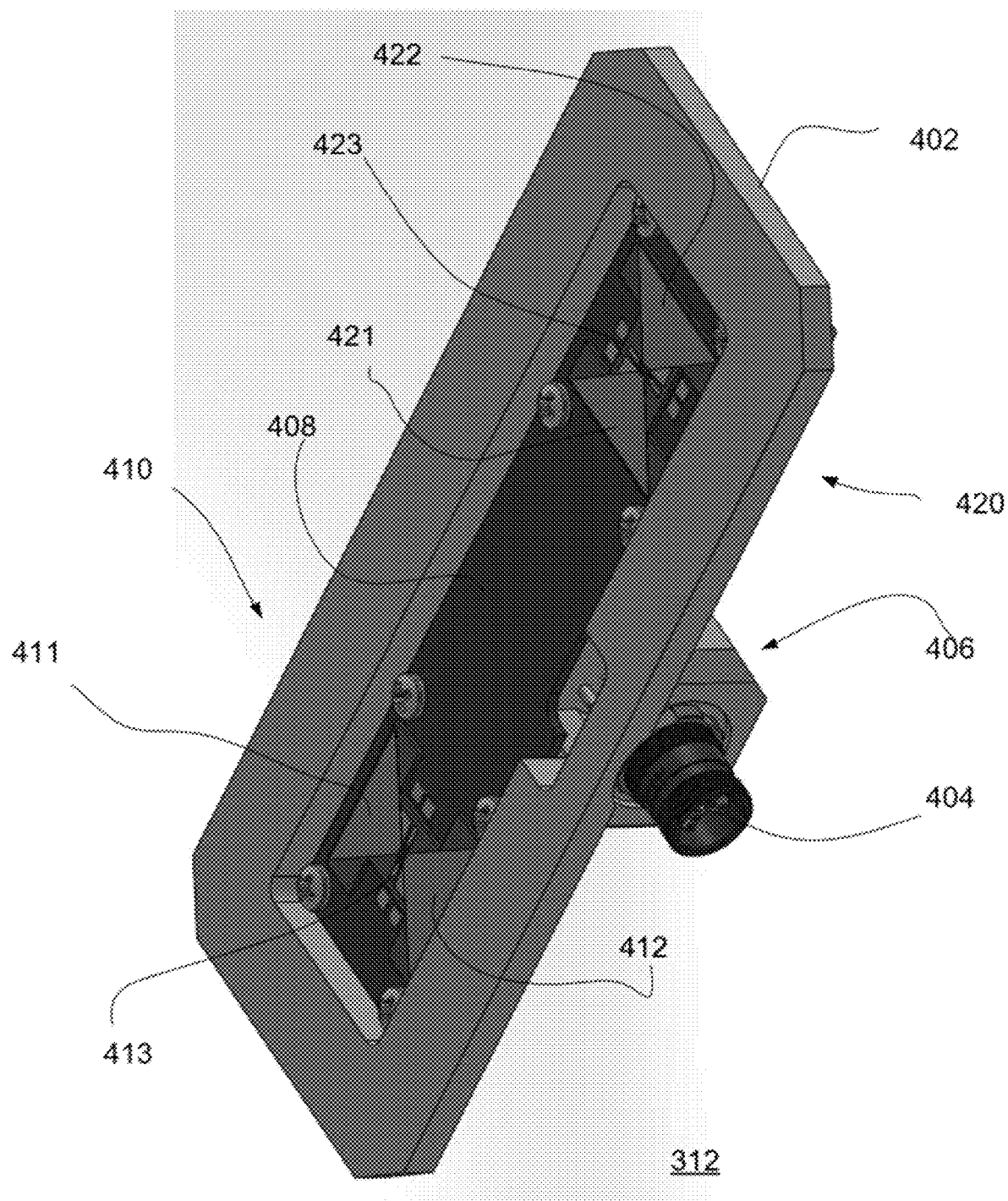
FIG. 9 is an example a sensing unit according to some embodiments.

FIG. 9 is an example of a sensing unit 312 that includes two magnetic sensors. It should be noted that the sensing unit may include a single magnetic sensor or more than two magnetic sensors.

The first magnetic sensor 410 includes a first magnetic flux concentrator 411, and a second magnetic flux concentrator 412 that are integrated with a first magnetometer 413.

The second magnetic sensor 420 includes a third magnetic flux concentrator 421, and a fourth magnetic flux concentrator 422 that are integrated with a second magnetometer 423.

In orientation of the first magnetic sensor 410 differs (for example differs by ninety degrees) from the orientation of the second magnetic sensor 420. Accordingly, two different components of the magnetic field are sensed by the sensing unit 312.

The two magnetic sensors are located within a housing 402 that has a port 404 for electrically coupling the circuitry 406 to electrical units outside the sensing unit.

The two magnetic sensors are mechanically coupled to printed circuit board (PCB) 408 and are electrically coupled to the circuitry 406. The circuitry 406 is mostly concealed behind the housing 402 and the PCB 408. The circuitry may measure signals, may provide signals, may supply power, may generate detection signals indicative of sensed magnetic fields, and the like.

Figure 10:
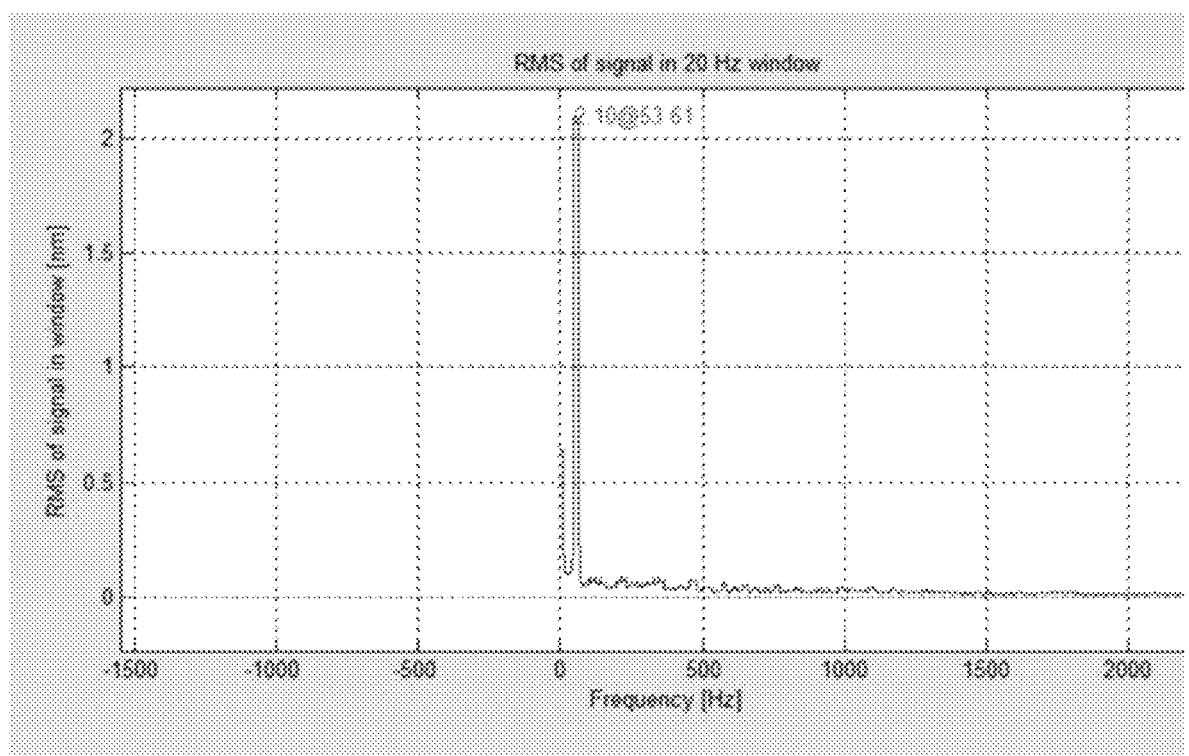
FIG. 10 is an example of a distortion of a scan line using a compensation based on a prior art external magnetic sensor.
Figure 11:
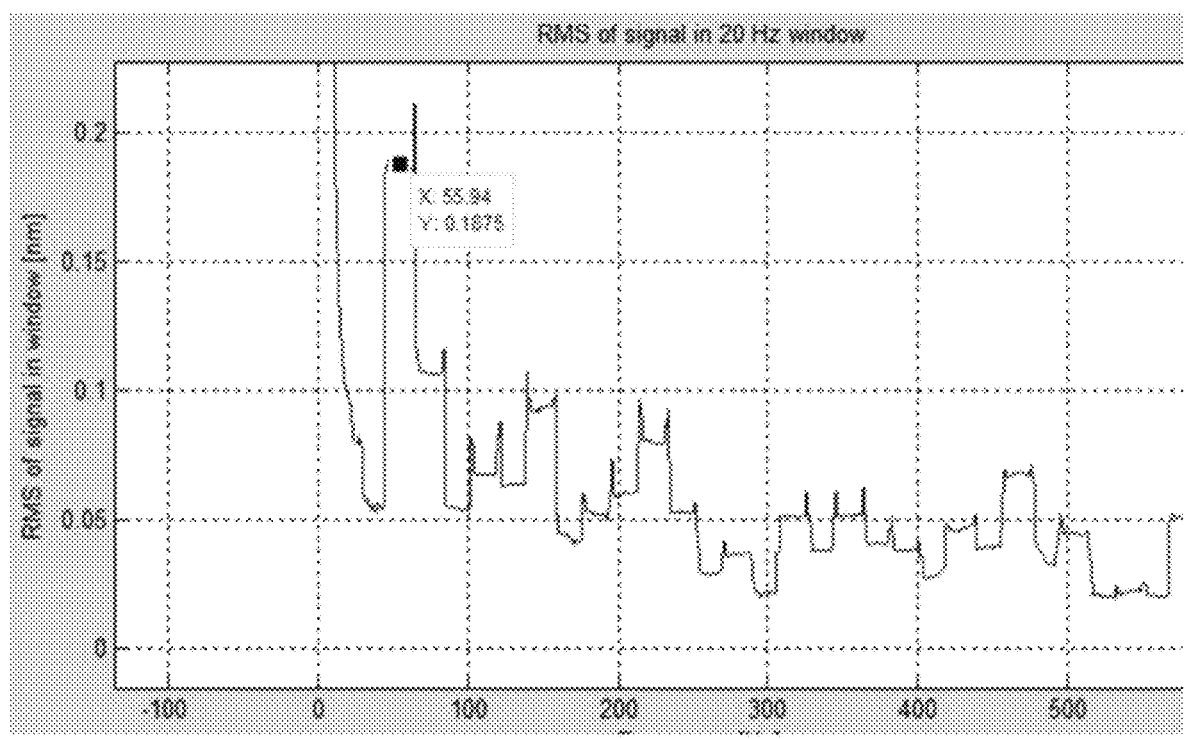
FIG. 11 is an example of a distortion of a scan line using a compensation based on a magnetic sensor located within the electron beam tool according to some embodiments.

FIGS. 10 and 11 illustrate distortions obtained when the electromagnetic interference had a frequency of 55 Hertz.

Both figures illustrate a root mean square (RMS) of a scan line versus frequency. The different pixels that form the scan line were Fast Fourier Transformed to provide a spectral representation of the scan line.

Graph 510 of FIG. 10 illustrates a scan line deviation having an RMS of 2.1 nanometer at 55 Hertz.

Graph 520 of FIG. 11 illustrates a scan line deviation having an RMS of 0.2 nanometer at 55 Hertz.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

What is claimed is:

1. A method for compensating for an electromagnetic interference induced deviation of an electron beam, the method comprising:
    obtaining measurement information about a magnetic field within an electron beam tool, the measurement information is generated by at least one planar Hall Effect magnetic sensor that is located within the electron beam tool, wherein the at least one planar Hall Effect magnetic sensor comprises at least one magnetometer integrated with at least one magnetic flux concentrator;
    estimating, based on the magnetic field, the electromagnetic interference induced deviation of the electron beam; and
    setting a trajectory of the electron beam to compensate for the electromagnetic interference induced deviation of the electron beam.

2. The method according to claim 1 wherein the setting of the trajectory of the electron beam comprises causing the electron beam to follow an expected scan pattern despite a presence of the electromagnetic interference.

3. The method according to claim 2 wherein the obtaining, estimating, and the setting are repeated during an acquisition of a frame.

4. The method according to claim 1 further comprising setting the trajectory of the electron beam during an acquisition of a current frame, wherein the setting of the trajectory is based on the estimating of the electromagnetic interference induced deviation of the electron beam during an acquisition of a previous frame.

5. The method according to claim 1 wherein the magnetic field comprises multiple magnetic field components, wherein the at least one planar Hall Effect magnetic sensor comprises multiple planar Hall Effect magnetic sensors.

6. The method according to claim 5 wherein the multiple magnetic field components differ from each other by direction.

7. The method according to claim 5 wherein the multiple planar Hall Effect magnetic sensors are positioned to measure magnetic fields at different locations along a path that is proximate to a path of the electron beam.

8. The method according to claim 1 wherein the electron beam propagates along a path that starts at an end of a an electron beam column and ends at a sample, wherein the at least one planar Hall Effect magnetic sensor is positioned to sense the magnetic field at a start of the path or an end of the path.

9. The method according to claim 1 wherein the at least one planar Hall Effect magnetic sensor has an equivalent magnetic noise that does not exceed 5 pT/√Hertz at 10 Hertz.

10. The method according to claim 1 wherein the setting comprises feeding compensating control signals to one or more electron beam deflectors.

11. A system for compensating for an electromagnetic interference induced deviation an electron beam of an electron beam tool, the system comprising:
    at least one planar Hall Effect magnetic sensor that comprises at least one magnetometer integrated with at least one magnetic flux concentrator; wherein the at least one planar Hall Effect magnetic sensor is configured, when located within the electron beam tool, to measure a magnetic field within the electron beam tool;
    a deviation estimator that is configured to estimate, based on the magnetic field, the electromagnetic interference induced deviation of the electron beam; and a controller that is configured to set a trajectory of the electron beam to compensate for the electromagnetic interference induced deviation of the electron beam.

12. The system according to claim 11 wherein the controller is further configured to cause the electron beam to follow an expected scan pattern despite a presence of electromagnetic interference.

13. The system according to claim 12 wherein the electron beam propagates along a path that starts at an end of a an electron beam column and ends at a sample, wherein the at least one planar Hall Effect magnetic sensor is positioned to sense the at least one magnetic field at a start of the path or an end of the path.

14. The system according to claim 11 wherein the at least one planar Hall Effect magnetic sensor has an equivalent magnetic noise that does not exceed 5 pT/√Hertz at 10 Hertz.

15. A non-transitory computer readable medium that stores instructions for:
- obtaining measurement information about a magnetic field within an electron beam tool, the measurement information is generated by at least one planar Hall Effect magnetic sensor that is located within the electron beam tool; wherein the at least one planar Hall Effect magnetic sensor comprises at least one magnetometer integrated with at least one magnetic flux concentrator;
- estimating, based on the magnetic field, an electromagnetic interference induced deviation of the electron beam; and
- setting a trajectory of the electron beam to compensate for the electromagnetic interference induced deviation of the electron beam.

* * * * *